United States Patent
Chauhan et al.

(10) Patent No.: US 8,053,873 B2
(45) Date of Patent: Nov. 8, 2011

(54) IC HAVING VOLTAGE REGULATED INTEGRATED FARADAY SHIELD

(75) Inventors: Satyendra S Chauhan, Sugarland, TX (US); Gregory E Howard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 268 days.

(21) Appl. No.: 12/477,002

(22) Filed: Jun. 2, 2009

(65) Prior Publication Data
US 2009/0302438 A1    Dec. 10, 2009

Related U.S. Application Data

(60) Provisional application No. 61/059,426, filed on Jun. 6, 2008.

(51) Int. Cl.
*H01L 23/552* (2006.01)
(52) U.S. Cl. .................. 257/659; 257/E23.002
(58) Field of Classification Search .......... None
See application file for complete search history.

(56) References Cited

U.S. PATENT DOCUMENTS

| 2001/0011964 A1* | 8/2001 | Sadler et al. ............ 343/824 |
| 2004/0238857 A1* | 12/2004 | Beroz et al. ............ 257/232 |
| 2007/0197013 A1 | 8/2007 | Trezza |
| 2009/0075428 A1* | 3/2009 | Tang et al. ............ 438/114 |

OTHER PUBLICATIONS

IEEE Microwave and Wireless Components Letters, Vol. II, No. 10, Oct. 2001, pp. 410-412 "A Faraday Cage Isolation Structure for Substrate Crosstalk Suppression" Wu, Joyce H., et al.
Radio Frequency Integrated Circuites (RFIC) Symposium, 2004. Digest of Papers. 2004 IEEE vol. VI, Issue 8, Jun. 2004, pp. 635-638 "An Equivalent Circuit Model for a Faraday Cage Substrate Crosstalk Isolation Structure" Wu, Joyce H., et al.
IEEE Transactions on Electron Devices, vol. 51, No. 11, Nov. 2004, pp. 1765-1771 "A Through-Wafer Interconnect in Silicon for RFICs" Wu, Joyce H., et al.

* cited by examiner

*Primary Examiner* — Minh-Loan T Tran
*Assistant Examiner* — Fei Fei Yeung Lopez
(74) *Attorney, Agent, or Firm* — Yingsheng Tung; Wade J. Brady, III; Frederick J. Telecky, Jr.

(57) ABSTRACT

An integrated circuit (IC) includes a substrate having a top semiconductor surface and a bottom surface, and integrated circuitry including an analog subcircuit and at least one digital subcircuit formed on the top semiconductor surface. A plurality of through substrate vias (TSVs) extend through the substrate. At least one integrated Faraday shield includes a top and a bottom electrically conducting member that are coupled by the TSVs which surround the analog subcircuit and/or the digital subcircuit. At least one voltage regulator supplies a regulated power supply voltage that is coupled to the integrated Faraday shield that surrounds the analog subcircuit.

19 Claims, 3 Drawing Sheets

IC HAVING VOLTAGE REGULATED INTEGRATED FARADAY SHIELD

CROSS REFERENCE TO RELATED APPLICATIONS

This application claims the benefit of Provisional Application Ser. No. 61/059,426 entitled "TSV ENABLED INTEGRATED AND REGULATED RF SHIELDING", filed Jun. 6, 2008, which is herein incorporated by reference in its entirety.

FIELD OF THE INVENTION

Embodiments of the invention relate to electronic systems comprising integrated circuits (ICs) and Faraday shielding for reducing electromagnetic interference (EMI) to or from the IC(s).

BACKGROUND

EMI is generally defined to include all potential sources of interference (i.e. unwanted disturbances, or noise) that can compromise the performance of electrical circuits due to electromagnetic coupling including RF interference. EMI is known to propagate in the solid state through conduction over signal and power lines and through the substrate, and also over the air as electromagnetic radiation in free space. For example, RF receivers are known to need good noise immunity for reception of low-level signals.

RF shielding is known for reducing EMI. Traditional RF shielding is implemented with external metal "cans" that encapsulate and shield the RF IC section on a circuit board (e.g., PCB). However, this implementation is costly and time consuming, as the metal cans used for RF shielding must be customized according to individual circuit boards. Additionally, metal cans being external shields increase the space requirements for RF sections and, more significantly, can degrade the performance of the underlying RF circuitry, such as by itself acting as a broadcast antenna of RF noise. This performance degradation generally leads to a time-consuming retuning process that may be necessary to limit the effects of the metal can. Moreover, although metal cans can significantly reduce radiated EMI including radiated RFI, metal cans do not provide protection from EMI coupled through a common monolithic IC substrate (e.g., bulk silicon) referred to herein as "substrate coupling," as described below.

Another RF shielding arrangement is generally referred to as package-level plating. The plating is applied at the package level (as opposed to wafer level) and the plating is positioned both above and below the RF IC, such as on different layers of a multi-layer PCB. As with metal cans, a limitation of package-level plating is the inability to provide protection from substrate coupling.

Substrate coupling is another form of EMI which involves substrate noise which can couple through a common monolithic substrate (e.g., bulk silicon). Substrate coupling can be a significant problem particularly for monolithic mixed signal RF comprising ICs. In the digital portion of such ICs there are generally a large number of logic gates which generally undergo transitions at a high frequency during normal operation. When such a transition occurs, a spike of current can be absorbed from the power bus. Usually a significant portion of this current is passed through the ground bus through direct feedthrough and a portion is also generally injected into the common monolithic substrate.

Generally, in mixed signal systems, such substrate noise can corrupt the sensitive low level analog circuitry (e.g., RF subcircuits) and thus impair the performance of the mixed signal IC. Substrate noise can generally be reduced by the circuit layout (e.g., larger spacings between digital logic and RF circuitry) and certain isolation techniques. Although substrate coupling can be partially isolated by using wells (e.g., junction isolation with guard rings), in the case of bulk substrates (e.g., silicon), the bulk substrate will generally still remain coupled to the sensitive circuitry.

SUMMARY

Embodiments of the invention describe ICs including integrated Faraday shields formed during the wafer fabrication process that comprise through substrate vias (TSVs) arranged in a cage-like pattern to surround or "cage" the EMI sensitive circuitry (e.g., an RF subcircuit) and/or noisy circuitry to protect the sensitive circuitry from EMI. Unlike conventional metal cans and the package-level plating approaches described above, integrated Faraday shields according to embodiments of the invention are integrated into the IC substrate itself, and generally use existing materials, wafer fabrication processes, and structures. The TSVs are electrically coupled to electrically conducting members on the top and bottom surface of same substrate (e.g., silicon) to form an integrated Faraday shield. In the case of a silicon substrate, the TSVs comprise through silicon vias.

The integrated Faraday shield thus surrounds and protects the sensitive circuitry from both radiated EMI and substrate coupled EMI. Regarding substrate coupled EMI, the TSV's create an isolated substructure which decouples the sensitive circuitry from the noisy circuitry (e.g., digital logic circuitry) formed on the common substrate.

Integrated Faraday shields according to embodiments of the invention thus allow integration of on-chip switching networks (e.g., digital control circuitry including digital logic) which can be isolated from the other circuitry which may be sensitive circuitry (e.g., low noise analog circuitry, such as RF subcircuits) on the same chip (except in one embodiment through predetermined ports), as well as the effective creation of a chip within a chip concept with on-chip chip to chip isolation. Embodiments of the invention can be extended to the case of a multi-chip isolated sub-system which includes a plurality of integrated Faraday shields on the same IC.

In some embodiments of the invention, a voltage regulator that provides a regulated "clean" power supply rail is generally coupled to clamp the potential on the integrated Faraday shield. The voltage regulator can be formed on the same IC with the active circuitry, such as within the same integrated Faraday shield, or on top or below the IC having the active circuitry and integrated Faraday shield. The voltage regulator can itself include an integrated Faraday shield. In another embodiment of the invention, more than one voltage regulator is provided, which can provide a plurality of clean different voltage levels for the IC.

DETAILED DESCRIPTION

Figure 1:
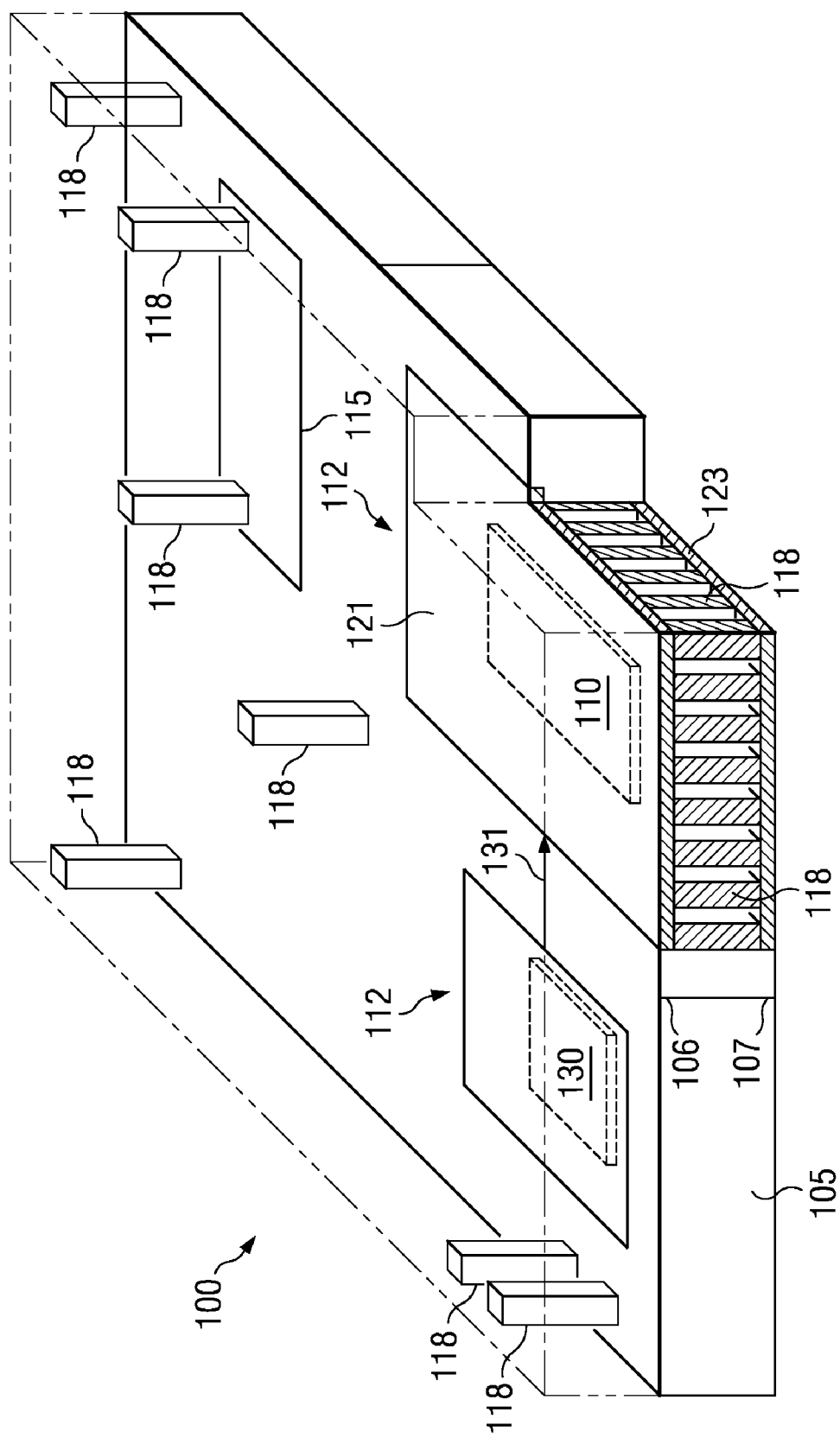
FIG. 1 is a partial cutaway cross sectional view of an IC comprising an analog subcircuit and a digital subcircuit, and an integrated Faraday shield comprising a plurality of TSVs for protecting the analog subcircuit from EMI, according to an embodiment of the invention.

Embodiments of the invention are described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. Embodiments of the invention are not limited by the illustrated ordering of acts or events, as some acts may occur in different orders and/or concurrently with other acts or events. Furthermore, not all illustrated acts or events are required to implement a methodology in accordance with this disclosure.

Referring to FIG. 1, a partial cutaway cross sectional view of an IC 100 is shown comprising integrated circuitry including an analog subcircuit 110, a digital subcircuit 115, and an integrated Faraday shield 112 comprising a plurality of TSVs 118 for protecting the analog subcircuit 110 from EMI, according to an embodiment of the invention. The analog subcircuit 110 is generally a noise sensitive circuit such as an RF subcircuit (e.g., RF receiver) and the digital subcircuit 115 generally comprises noise generating circuitry, such as CMOS logic. In one particular embodiment, IC 100 can comprise a digital receiver IC when IC 100 generally includes an RF circuit and a digital demodulation circuit.

IC 100 comprises a substrate 105 comprising a top semiconductor surface 106 and a bottom surface 107. The analog subcircuit 110 and digital subcircuit 115 are formed on the top semiconductor surface 106.

TSVs 118 are shown extending from the top semiconductor surface 106 to at least the bottom surface 107 of substrate 105 to electrically couple a metallization layer (e.g., metal interconnect layer) on the top of the IC 100 shown as the top electrically conducting member 121 to the bottom electrically conducting member 123. TSVs 118 are also shown outside of the integrated Faraday shield 112, such as for use as bonding conductors to couple power, ground and I/Os to IC 100 from an underlying workpiece (e.g., a package substrate or another IC). As known in the art, TSVs 118 comprise electrically conductive material within, such as copper, tungsten or heavily doped polysilicon, and generally include a refractory barrier layer and a dielectric liner. Top electrically conducting member 121 and bottom electrically conducting member 123 are shown as continuous plates that are parallel to one another. In another embodiment (not shown), top electrically conducting member 121 and bottom electrically conducting member 123 are ring shaped having open center regions. Embodied as a continuous plate, top electrically conducting member 121 provides essentially total isolation of the circuitry underneath of the plate to externally generated EMI as well as reduces the EMI to external devices from the circuitry within the integrated Faraday shield 112.

Bottom electrically conducting member 123 can be formed by adding a process step to a conventional wafer fabrication sequence, such as backside metal deposition after backgrind on the bottom surface 107 of a wafer including a plurality of ICs 100 followed by optional patterning to localize the backside metal layer in the area of integrated Faraday shield 112. An advantage of forming bottom electrically conducting member 123 in this way is that bottom electrically conducting member 123 can be thicker than would be typical in conventional wafer fabrication process, such as on the order of several microns thick, or more.

The top electrically conducting member 121 can generally utilize any of the metal interconnect layers such that the noisy/sensitive signal(s) are wholly contained in the integrated Faraday shield 112. Although only a single metal interconnect layer is shown in FIG. 1 with a portion of the interconnect layer used for the top electrically conducting member 121, IC 100 generally includes multiple metallization layers, and the top electrically conducting member 121 of integrated Faraday shield 112 can be formed on any of the metallization layers. Alternatively, in one embodiment (see FIG. 4), top electrically conducting member 121 can include portions from a plurality of different metallization layers that are connected using vias as known in the art.

IC 100 is shown including an on-chip voltage regulator 130 that is coupled to the integrated Faraday shield 112 surrounding analog subcircuit 110 for clamping the voltage on that integrated Faraday shield 112. However, in other embodiments of the invention, the voltage regulator 130 can be off-chip, such as above or below the IC 100. Voltage regulator 130 supplies a regulated DC power supply voltage 131 to the integrated Faraday shield 112 surrounding analog subcircuit 110, such as a ground potential in one embodiment. Voltage regulator is shown including its own integrated Faraday shield 112. On-chip voltage regulator 130 can comprise a linear regulator. Linear regulators are based on devices that operate in their linear region. In contrast, a switching regulator is based on a device forced to act as an on/off switch. Accordingly, linear regulators are inherently lower noise regulators as compared to switching regulators.

As described above, in general, at least one of the analog subcircuit 110 and the digital subcircuit 115 include an integrated Faraday shield 112. Accordingly, although the digital subcircuit 115 is shown not having an integrated Faraday shield 112 in FIG. 1, in other embodiments of the invention the digital subcircuit includes an integrated Faraday shield 112.

IC 100 may operate with three or more power supply levels (i.e. ground and two other levels). Since there can generally be multiple power supply levels for a given IC design, particularly for mixed signal ICs (e.g., one digital supply voltage (e.g., 1.8 V or 3.3V) for LVDS single ended signals, another lower digital supply voltage for differential signals (e.g., 1.0V, or 0.9V), and yet another voltage (usually higher) RF Analog supply for RF power transmission signals (e.g., 5V or 7V), and at least one ground, embodiments of the invention can include a plurality of voltage regulators, such as a voltage regulator for regulating each of the power supply levels.

Regarding substrate coupling, the Inventors have discovered that integrated Faraday shields generally have frequency limitations which are defined by the TSV 118 to TSV 118 spacing (referred to herein as the "TSV spacing"). Specifically, the highest effective frequency that integrated Faraday shields can generally provide protection is when the maximum TSV spacing is <1/10th of a wavelength. Accordingly, as maximum frequency for which substrate coupling protection is desired is increased, the maximum TSV spacing is generally decreased.

For typical applications in silicon substrates for up to 1 GHz operation, the wavelengths are on the order of 10's to 100's of mm. In the 60 to 100 GHz range, for example, the wavelengths are around 2 mm. For typical RF circuits, the TSV spacing should be at most about 200 microns for protection against high frequency (e.g., 60 GHz) substrate noise. For protection up to about 200 GHz, the maximum TSV spacing is generally at most 50 microns. In one embodiment, a 50 micron TSV spacing can be achieved using an offset 100 micron via spacing (two rows of TSVs offset by ½ the TSV spacing) which has an effective TSV spacing of 50 microns.

Figure 2:
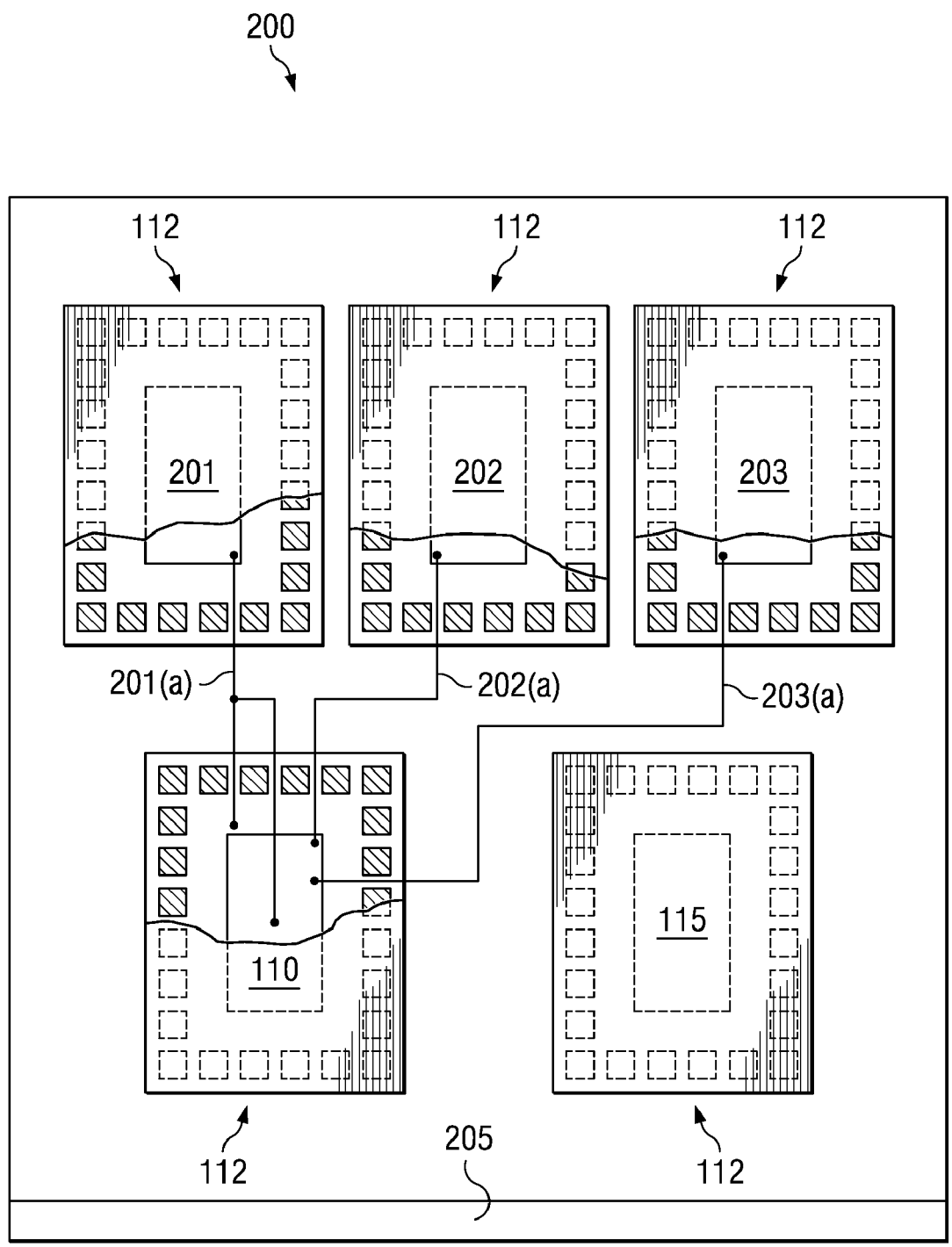
FIG. 2 is a depiction of an IC comprising integrated circuitry including an analog subcircuit, a digital subcircuit, a plurality of integrated Faraday shields, and a plurality of voltage regulators for supplying a plurality of different regulated voltage levels for the IC, according to an embodiment of the invention.

FIG. 2 shows a depiction of an IC 200 comprising substrate having a semiconductor surface 205 and integrated circuitry including an analog subcircuit 110, a digital subcircuit 115 and a plurality of voltage regulators 201, 202 and 203 for supplying a plurality of different regulated voltage levels for the IC, and a plurality of integrated Faraday shields 112, according to an embodiment of the invention. Voltage regulator 201 includes its own integrated Faraday shield 112 and provides a first voltage level output, such as a reference ground, via coupling line 201(*a*) to both the analog subcircuit 110 and the integrated Faraday shield 112 associated with analog subcircuit 110. When the first voltage level output is a ground, the coupling line 201(*a*) connects and provides a reference ground that is common between the integrated Faraday shield 112 for voltage regulator 201 and the integrated Faraday shield 112 for analog subcircuit 110. Voltage regulator 202 includes its own integrated Faraday shield 112 and provides a second voltage level output via coupling line 202(*a*) to the analog subcircuit 110. Voltage regulator 203 includes its own integrated Faraday shield 112 and provides a third voltage level output via coupling line 203(*a*) to the analog subcircuit 110.

Each voltage regulator can be generally referenced to the integrated Faraday shield 112 for the circuitry that it is providing the voltage reference for. By dividing the IC in this manner, the internal voltages on IC 100 can be clean generally regardless of the variations in the external power/ground supplies since the internal voltages can be referenced to internally referenced potentials, such as an internally referenced ground.

Figure 3:
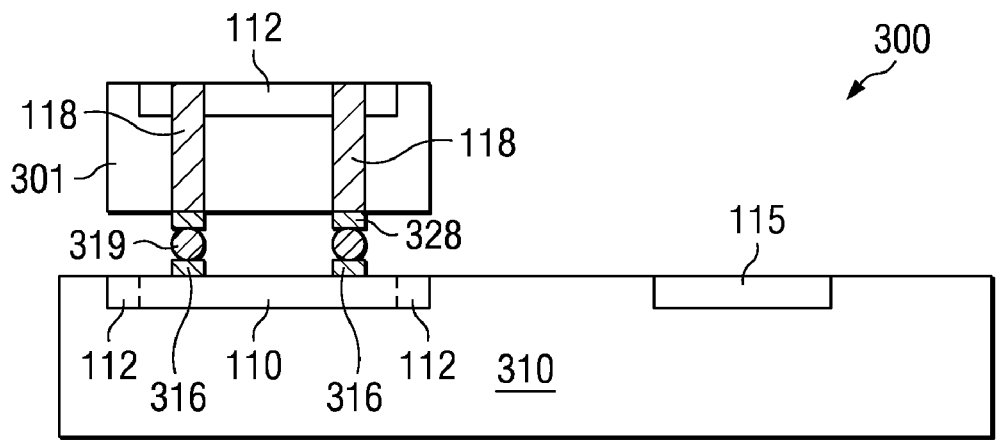
FIG. 3 shows a cross sectional depiction of a stacked die electronic assembly according to an embodiment of the invention comprising a regulator IC bonded to and on top of a mixed signal IC that comprises an analog subcircuit and digital subcircuit having an integrated Faraday shield surrounding the analog subcircuit.

A typical regulator IC will generally be smaller in area than the mixed signal IC which it regulates. This aspect makes it generally difficult to place the regulator IC beneath the mixed signal IC in a stacked die/TSV arrangement. FIG. 3 shows a cross sectional depiction of a stacked die electronic assembly 300 according to an embodiment of the invention comprising a regulator IC 301 that is bonded to and on top of a mixed signal IC 310 comprising analog subcircuit 110 and digital subcircuit 115 having an integrated Faraday shield 112 surrounding the analog subcircuit 110. Regulator IC 301 is shown bonded face-up using its TSVs 118 having TSV tips 328 to contact pads 316 of mixed signal IC 310 using solder mediation layer 319 as shown in FIG. 3. Alternatively, regulator IC 301 can be bonded to mixed signal IC 310 as a flip chip.

As noted above, the top metal layer for providing top electrically conducting member 121 can generally be any of the interconnect layers such that the noisy/sensitive signal(s) are contained in the integrated Faraday shield. In another embodiment of the invention, the top electrically conducting member 121 comprises areas of different metal interconnect layers that are selected and interconnected so that the integrity of the shield is maintained. In this embodiment the top electrically conducting member 121 of the Faraday shield is not planar/smooth, but instead varies throughout the shield region with different top layers in different sections of the IC. This embodiment has the advantage of being able to route external signals within a "protected" subcircuit.

Figure 4:
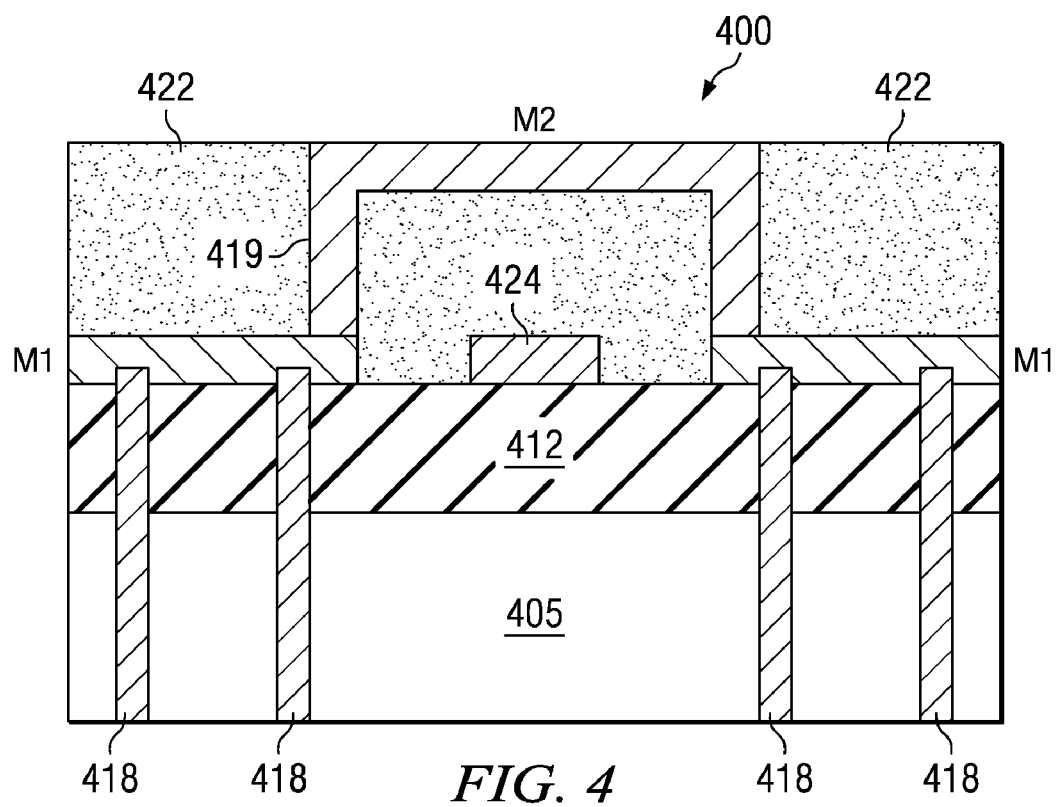
FIG. 4 shows a cross sectional depiction of a portion of an analog subcircuit that includes an integrated Faraday shield that includes a top electrically conducting member that includes areas of different metal interconnect layers, according to an embodiment of the invention.

FIG. 4 shows a cross sectional depiction of a portion 400 of an analog subcircuit that includes an integrated Faraday shield that includes a top electrically conducting member that includes areas of different metal layers according to an embodiment of the invention. The TSVs 418 comprising the integrated Faraday shield are shown reaching through pre-metal dielectric layer 412 to contact the first metal interconnect layer shown as M1. Interlevel dielectric layer 422 is shown on the M1 layer. The second metal layer shown as M2 is coupled to M1 layer via vias 419. Within the integrated Faraday shield the M1 layer is shown including M1 signal line 424. Although portion 400 in FIG. 4 is shown utilizing M1 and M2, those having ordinary skill in the art will recognize this embodiment of the invention are not limited to this particular arrangement since the metal interconnect layers can be combinations others that M1 and M2, and portion 400 can also utilize three or more metal interconnect layers.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of embodiments of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. An integrated circuit (IC), comprising:
    a substrate having a substrate area comprising a top semiconductor surface and a bottom surface;
    integrated circuitry including at least one analog subcircuit and at least one digital subcircuit formed in or on said top semiconductor surface;
    a plurality of through substrate vias (TSVs) extending from said top semiconductor surface to at least said bottom surface on at least a portion of said substrate area, and
    at least one integrated Faraday shield for surrounding said analog subcircuit or said digital subcircuit, wherein said integrated Faraday shield comprises:
        a top electrically conducting member on said top semiconductor surface, and
        a bottom electrically conducting member on said bottom surface,
        wherein at least a portion of said plurality of TSVs couple said top electrically conducting member to said bottom electrically conducting member, and,
        at least one voltage regulator for supplying a regulated power supply voltage, said regulated power supply voltage coupled to said integrated Faraday shield; and
    at least one portion of said plurality of TSVs are outside an area shielded by said integrated Faraday shield.

2. The IC of claim 1, wherein said regulated power supply voltage is also coupled to said analog subcircuit.

3. The IC of claim 1, wherein said regulated power supply voltage comprises a ground reference voltage, and wherein said ground reference voltage is coupled to said analog subcircuit.

4. The IC of claim 1, wherein said voltage regulator is formed in or on said top semiconductor surface of said IC.

5. The IC of claim 4, wherein said at least one integrated Faraday shield comprises a first integrated Faraday shield for shielding said analog subcircuit and a second integrated Faraday shield for shielding said voltage regulator.

6. The IC of claim 1, wherein said voltage regulator comprises a regulator IC that is separate from said IC.

7. The IC of claim 6, wherein said regulator IC is bonded face-up on top of said IC to form a stacked die arrangement.

8. The IC of claim 1, wherein said top electrically conducting portion and said bottom electrically conducting portion both comprise continuous plates.

9. The IC of claim 1, wherein said at least one voltage regulator comprises at least a first voltage regulator including said integrated Faraday shield for supplying a first regulated power supply voltage and a second voltage regulator having integrated Faraday shield for supplying a second regulated power supply voltage, wherein said first regulated power supply voltage and said second regulated power supply voltage are both coupled to said analog subcircuit.

10. The IC of claim 9, wherein said first and said second voltage regulator are both formed in or on said top semiconductor surface of said IC.

11. The IC of claim 1, wherein voltage regulator comprises a linear regulator.

12. The IC of claim 1, wherein said IC comprises a digital receiver IC, said analog subcircuit comprises an RF subcircuit, and said digital subcircuit comprises a digital demodulation circuit.

13. The IC of claim 1, wherein said IC comprises a plurality of metal interconnect layer, and said top electrically conducting member comprises areas from two or more of said plurality of metal interconnect layers.

14. The IC of claim 13, further comprising a signal line within said integrated Faraday shield comprising at least one of said two or more of said plurality of metal interconnect layers.

15. An integrated circuit (IC), comprising:
    a substrate having a substrate area comprising a top silicon comprising surface and a bottom surface;
    integrated circuitry including at least one RF subcircuit and at least one CMOS logic subcircuit formed in or on said top semiconductor surface;
    a plurality of through silicon vias (TSVs) extending from said top semiconductor surface to at least said bottom surface on at least a portion of said substrate area, and
    at least one integrated Faraday shield for surrounding said RF subcircuit or said digital subcircuit, wherein said integrated Faraday shield comprises:
        a top electrically conducting member on said top semiconductor surface, and
        a bottom electrically conducting member on said bottom surface,
        wherein at least a portion of said plurality of TSVs couple said top electrically conducting member to said bottom electrically conducting member, and,
        at least one voltage regulator for supplying a regulated power supply voltage, said regulated power supply voltage coupled to said integrated Faraday shield and said RF subcircuit; and
    at least one portion of said plurality of TSVs are outside an area shielded by said integrated Faraday shield.

16. The IC of claim 15, wherein said voltage regulator is formed in or on said top semiconductor surface of said IC.

17. The IC of claim 16, wherein said at least one integrated Faraday shield comprises a first integrated Faraday shield for shielding said RF subcircuit and a second integrated Faraday shield for shielding said voltage regulator.

18. The IC of claim 15, wherein said at least one voltage regulator comprises at least a first voltage regulator including said integrated Faraday shield for supplying a first regulated power supply voltage and a second voltage regulator having integrated Faraday shield for supplying a second regulated power supply voltage, wherein said first regulated power supply voltage and said second regulated power supply voltage are both coupled to said RF subcircuit.

19. The IC of claim 18, wherein said first and said second voltage regulator are both formed in or on said top semiconductor surface of said IC.

* * * * *